(12) United States Patent
Yano et al.

(10) Patent No.: US 12,388,476 B2
(45) Date of Patent: Aug. 12, 2025

(54) TRANSMISSION CIRCUIT, ELECTRONIC CONTROL UNIT, AND VEHICLE

(71) Applicant: ROHM CO., LTD., Kyoto (JP)

(72) Inventors: Yuji Yano, Kyoto (JP); Toru Mukai, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 92 days.

(21) Appl. No.: 18/450,596

(22) Filed: Aug. 16, 2023

(65) Prior Publication Data

US 2023/0403039 A1   Dec. 14, 2023

Related U.S. Application Data

(63) Continuation of application No. PCT/JP2022/002571, filed on Jan. 25, 2022.

(30) Foreign Application Priority Data

Mar. 1, 2021   (JP) .................. 2021-031693

(51) Int. Cl.
*H04B 1/04* (2006.01)
*H03K 17/687* (2006.01)
*H04L 12/40* (2006.01)

(52) U.S. Cl.
CPC .............. *H04B 1/04* (2013.01); *H03K 17/687* (2013.01); *H04L 12/40032* (2013.01); *H04L 2012/40215* (2013.01); *H04L 2012/40273* (2013.01)

(58) Field of Classification Search
None
See application file for complete search history.

(56) References Cited

U.S. PATENT DOCUMENTS

| | | | |
|---|---|---|---|
| 5,781,028 A * | 7/1998 | Decuir | H04L 5/16 |
| | | | 326/86 |
| 6,605,958 B2 * | 8/2003 | Bergman | H05K 1/0246 |
| | | | 327/108 |

(Continued)

FOREIGN PATENT DOCUMENTS

JP    S61-195453    8/1986

OTHER PUBLICATIONS

International Search Report and Written Opinion in International Appln. No. PCT/JP2022/002571, mailed on Apr. 12, 2022, 13 pages (with machine translation).

*Primary Examiner* — Kenneth B Wells
(74) *Attorney, Agent, or Firm* — Fish & Richardson P.C.

(57) ABSTRACT

A transmission circuit includes a first terminal configured so that a first voltage is applied thereto, a second terminal, a third terminal, and a fourth terminal configured so that a second voltage lower than the first voltage is applied thereto. The transmission circuit further includes a first variable resistor portion provided between the first terminal and the second terminal, a first current restriction portion configured to restrict a current flowing from the first terminal to the second terminal, a second variable resistor portion provided between the third terminal and the fourth terminal, a second current restriction portion configured to restrict a current flowing from the third terminal to the fourth terminal, and a control portion configured to control, based on transmission data, the respective resistance values of the first variable resistor portion and the second variable resistor portion.

5 Claims, 7 Drawing Sheets

(56) References Cited

U.S. PATENT DOCUMENTS

| | | | | |
|---|---|---|---|---|
| 6,639,423 B2* | 10/2003 | Martin | ............ | H03K 19/01759 |
| | | | | 370/282 |
| 7,245,154 B1* | 7/2007 | Davidson | ......... | H03K 19/00346 |
| | | | | 326/82 |
| 7,439,760 B2* | 10/2008 | Nguyen | .............. | H04L 25/0278 |
| | | | | 326/86 |
| 7,936,180 B2* | 5/2011 | Chao | ................... | G06F 13/4072 |
| | | | | 326/86 |
| 9,299,440 B2* | 3/2016 | Grunzke | ........ | H03K 19/018571 |
| 9,984,033 B2* | 5/2018 | Rohr | ................... | G06F 13/4282 |
| 2007/0146284 A1* | 6/2007 | Kota | .................... | G09G 3/2096 |
| | | | | 345/98 |

* cited by examiner

TRANSMISSION CIRCUIT, ELECTRONIC CONTROL UNIT, AND VEHICLE

CROSS-REFERENCE TO RELATED APPLICATIONS

This nonprovisional application is a continuation application of International Patent Application No. PCT/JP2022/002571 filed on Jan. 25, 2022, which claims priority Japanese Patent Application No. 2021-031693 filed in Japan on Mar. 1, 2021, the entire contents of which are hereby incorporated by reference.

BACKGROUND OF THE INVENTION

1. Technical Field

An invention disclosed herein relates to a transmission circuit that transmits a differential signal and to an electronic control unit and a vehicle that include the transmission circuit.

2. Description of Related Art

Vehicles such as an automobile include a large number of electronic control units (ECUs) mounted therein. As a method of communication among the large number of ECUs, for example, CAN (controller area network) communication is employed (see, for example, Japanese Unexamined Patent Application Publication No. Sho 61-195453).

A transmission signal and a reception signal of the CAN communication are each a differential signal. The differential signal, which is constituted of a first signal and a second signal, can be decomposed into a common mode component and a differential mode component. The common mode component represents an average of the first signal and the second signal, and the differential mode component represents a difference between the first signal and the second signal.

DETAILED DESCRIPTION

Herein, a MOS transistor refers to a transistor whose gate structure is composed of at least three layers that are a "layer of an electric conductor or a semiconductor having a small resistance value, such as polysilicon," an "insulation layer," and a "p-type, n-type, or intrinsic semiconductor layer." That is, the gate structure of the MOS transistor is not limited to a three-layer structure composed of metal, oxide, and semiconductor layers.

Herein, a constant current refers to a current constant in an ideal state and is practically a current that may fluctuate slightly due to a temperature change or the like.

Herein, a constant voltage refers to a voltage constant in an ideal state and is practically a voltage that may fluctuate slightly due to a temperature change or the like.

<Vehicle and CAN Communication System>

Figure 1:
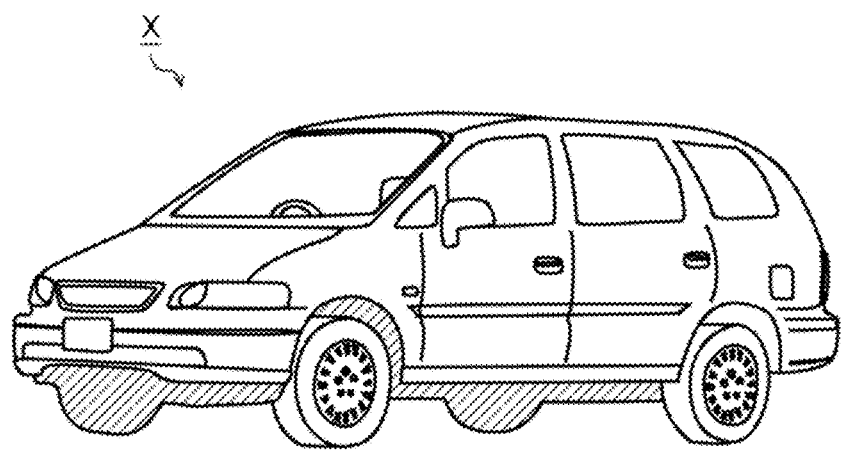
FIG. 1 is an appearance view of a vehicle according to an embodiment.

FIG. 1 is an appearance view of a vehicle X according to an embodiment. The vehicle X includes a plurality of ECUs 1 (not shown in FIG. 1). The vehicle X also includes a battery (not shown).

Figure 2:
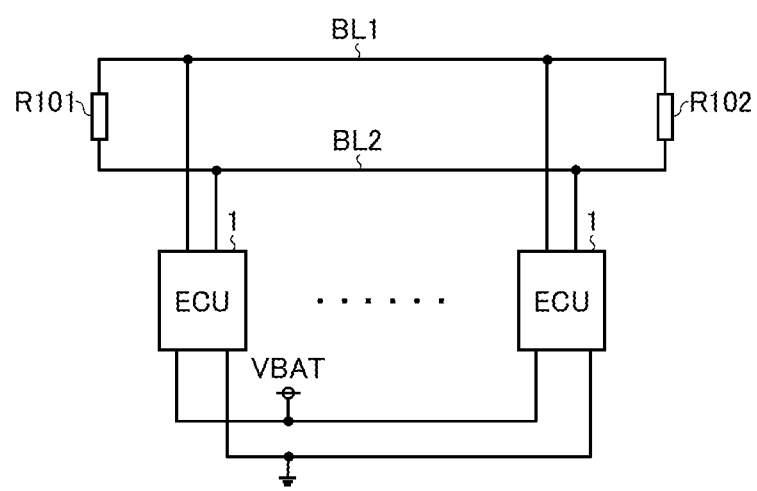
FIG. 2 is a schematic view of a CAN communication system.

FIG. 2 is a schematic view of a CAM communication system provided in the vehicle X. The CAN communication system shown in FIG. 2 includes the plurality of ECUs 1, a first bus line BL1, a second bus line BL2, and resistors R101 and R102.

One end of the resistor R101 is connected to one end of the first bus line BL1, and one end of the resistor R102 is connected to the other end of the first bus line BL1. The other end of the resistor R101 is connected to one end of the second bus line BL2, and the other end of the resistor R102 is connected to the other end of the second bus line BL2. Each of the plurality of ECUs 1 is connected to the first bus line BL1 and the second bus line BL2. A voltage VBAT outputted from the battery is supplied to each of the plurality of ECUs 1. Furthermore, each of the plurality of ECUs 1 is connected to a ground potential. The plurality of ECUs 1 use the voltage VBAT as a power supply voltage.

<Ecu>

Figure 3:
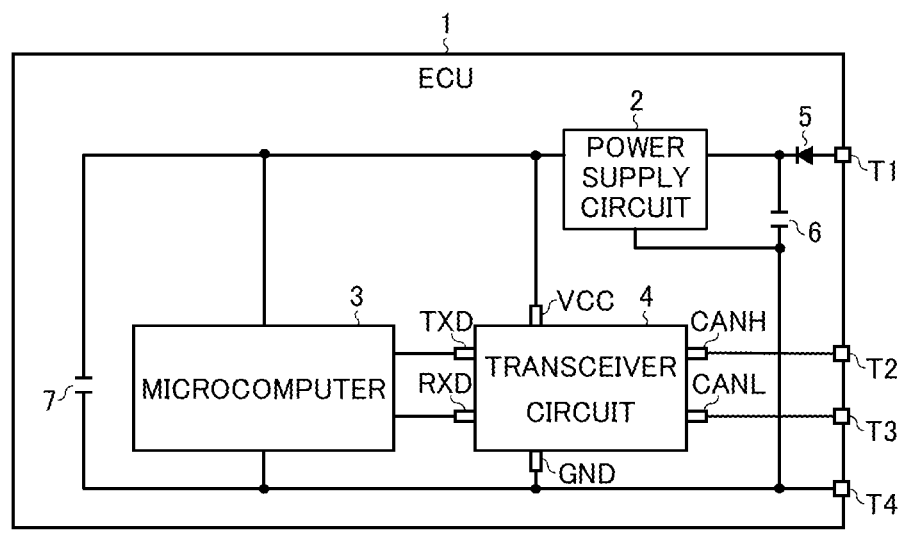
FIG. 3 is a view showing a configuration example of an ECU.

FIG. 3 is a view showing a configuration example of each of the ECUs 1. The ECU 1 of the configuration example shown in FIG. 3 includes terminals T1 to T4, a power supply circuit 2, a microcomputer 3, a transceiver circuit 4, a diode 5, and capacitors 6 and 7.

The voltage VBAT is supplied to the terminal T1. An anode of the diode 5 is connected to the terminal T1. A cathode of the diode 5 is connected to an input terminal of the power supply circuit 2 and the capacitor 6.

An output terminal of the power supply circuit 2 is connected to a power supply voltage input terminal of the microcomputer 3, a terminal VCC of the transceiver circuit 4, and one end of the capacitor 7. A constant voltage is outputted from the output terminal of the power supply circuit 2.

The microcomputer 3 transmits transmission data to a terminal TXD of the transceiver circuit 4 and receives reception data from a terminal RXD of the transceiver circuit 4. The transmission data and the reception data are each in the form of a single signal.

A terminal CANH of the transceiver circuit 4 is connected to the terminal T2, and a terminal CANL of the transceiver circuit 4 is connected to the terminal T3. The terminal T2 is connected to the first bus line BL1 shown in FIG. 2, and the terminal T3 is connected to the second bus line BL2 shown in FIG. 2.

The transceiver circuit 4 converts the transmission data into a differential signal (CAN signal) constituted of a first signal SCANH (see FIG. 5 referred to later) and a second signal SCANL (see FIG. 5 referred to later) and outputs the differential signal. Furthermore, the transceiver circuit 4 converts a differential signal (CAN signal) constituted of a first signal and a second signal into the reception data and outputs the reception data. That is, the transceiver circuit 4 includes a transmission circuit that transmits the differential signal and a reception circuit that receives the differential signal. The first signal is transmitted via the first bus line BL1, and the second signal is transmitted via the second bus line BL2.

A ground terminal of the power supply circuit 2 is connected to the other end of the capacitor 6, the terminal T4, a terminal GND of the transceiver circuit 4, a ground terminal of the microcomputer 3, and the other end of the capacitor 7. The terminal T4 is connected to the ground potential.

<Transceiver Circuit>

Figure 4:
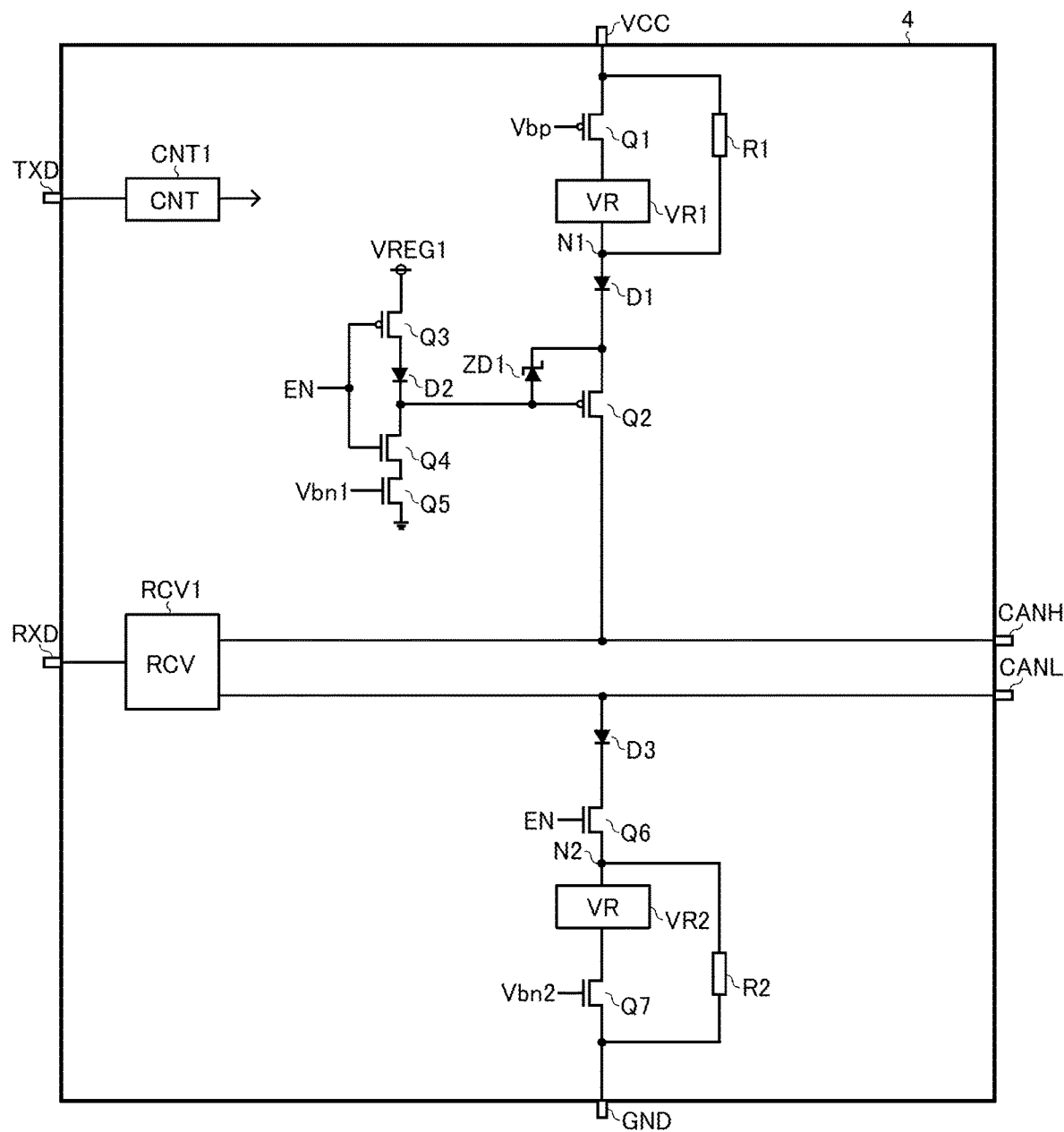
FIG. 4 is a view showing a configuration example of a transceiver circuit.

FIG. 4 is a view showing a configuration example of the transceiver circuit 4. The transceiver circuit 4 of the configuration example shown in FIG. 4 includes the terminal VCC, the terminal GND, the terminal TXD, the terminal RXD, the terminal CANH, and the terminal CANL.

The transceiver circuit 4 of the configuration example shown in FIG. 4 further includes a first variable resistor portion VR1, a second variable resistor portion VR2, a p-channel type MOS transistor (PMOS transistor) Q1 serving as a first current restriction portion, an n-channel type MOS transistor (NMOS transistor) Q7 serving as a second current restriction portion, and a control portion CNT1.

The transceiver circuit 4 of the configuration example shown in FIG. 4 further includes a pull-up resistor R1, a pull-down resistor R2, backflow prevention diodes D1 and D3, and a PMOS transistor Q2 and an NMOS transistor Q6 that are each a clamp element.

When the first variable resistor portion VR1 is brought to a high impedance state, the pull-up resistor R1 stabilizes a potential of a node N1 (a connection point between the first variable resistor portion VR1 and the diode D1). When the second variable resistor portion VR2 is brought to a high impedance state, the pull-down resistor R2 stabilizes a potential of a node N2 (a connection point between the second variable resistor portion VR2 and the NMOS transistor Q6).

The PMOS transistor Q2 and the NMOS transistor Q6 are each a double-diffused MOS transistor having a high withstand voltage. The PMOS transistor Q2 clamps a source potential of the PMOS transistor Q2, and the NMOS transistor Q6 clamps a source potential of the NMOS transistor Q6.

The transceiver circuit 4 of the configuration example shown in FIG. 4 includes a receiver circuit RCV1, a diode D2, a PMOS transistor Q3, an NMOS transistor Q4, an NMOS transistor Q5, and a Zener diode ZD1.

The terminal VCC is connected to a source of the PMOS transistor Q1 and one end of the pull-up resistor R1. A bias voltage Vbp, which is a constant voltage, is supplied to a gate of the PMOS transistor Q1. The PMOS transistor Q1, therefore, serves as a constant current source. In a case where the terminal CANH is short-circuited to a voltage value not more than that of a voltage applied to the terminal GND, the PMOS transistor Q1 restricts a current flowing from the terminal VCC to the terminal CANH. This can suppress an overcurrent flowing from the terminal VCC to the terminal CANH.

A drain of the PMOS transistor Q1 is connected to one end of the first variable resistor portion VR1. The other end of the first variable resistor portion VR1 is connected to the other end of the pull-up resistor R1 and an anode of the diode D1.

A cathode of the diode D1 is connected to a source of the PMOS transistor Q2. A drain of the PMOS transistor Q2 is connected to the terminal CANH and a first input terminal of the receiver circuit RCV1.

A gate drive signal generation circuit composed of the PMOS transistor Q3, the NMOS transistor Q4, the NMOS transistor Q5, the diode D2, and the Zener diode ZD1 generates a gate drive signal for the PMOS transistor Q2. An internal voltage VREG1 generated inside the transceiver circuit 4 is applied to a source of the PMOS transistor Q3. A drain of the PMOS transistor Q3 is connected to an anode of the diode D2. A cathode of the diode D2 is connected to an anode of the Zener diode ZD1 and a drain of the NMOS transistor Q4. A cathode of the Zener diode ZD1 is connected to the source of the PMOS transistor Q1. An enable signal EN is supplied to each of respective gates of the PMOS transistor Q3 and the NMOS transistor Q4. When the enable signal EN is at a high level, the transceiver circuit 4 is brought to an enable state. When, on the other hand, the enable signal EN is at a low level, the transceiver circuit 4 is brought to a disable state. A source of the NMOS transistor Q4 is connected to a drain of the NMOS transistor Q5. A source of the NMOS transistor Q5 is connected to the ground potential. A bias voltage Vbn1, which is a constant voltage, is supplied to a gate of the NMOS transistor Q5.

An anode of the diode D3 is connected to the terminal CANL and a second input terminal of the receiver circuit RCV1. A cathode of the diode D3 is connected to a drain of the NMOS transistor Q6. A source of the NMOS transistor Q6 is connected to one end of the second variable resistor portion VR2 and one end of the pull-down resistor R2. The enable signal EN is supplied to a gate of the NMOS transistor Q6.

The other end of the second variable resistor portion VR2 is connected to a drain of the NMOS transistor Q7. A source of the NMOS transistor Q7 is connected to the other end of the pull-down resistor R2 and the terminal GND. A bias voltage Vbp2, which is a constant voltage, is supplied to a gate of the NMOS transistor Q7. The NMOS transistor Q7, therefore, serves as a constant current source. In a case where the terminal CANL is short-circuited to a voltage value not less than that of a voltage supplied to the terminal VCC, the NMOS transistor Q7 restricts a current flowing from the terminal CANL to the terminal GND. This can suppress an overcurrent flowing from the terminal CANL to the terminal GND.

The control portion CNT1 receives transmission data supplied to the terminal TXD and controls, based on the transmission data, respective voltage values of the first variable resistor portion VR1 and the second variable resistor portion VR2.

Figure 5:
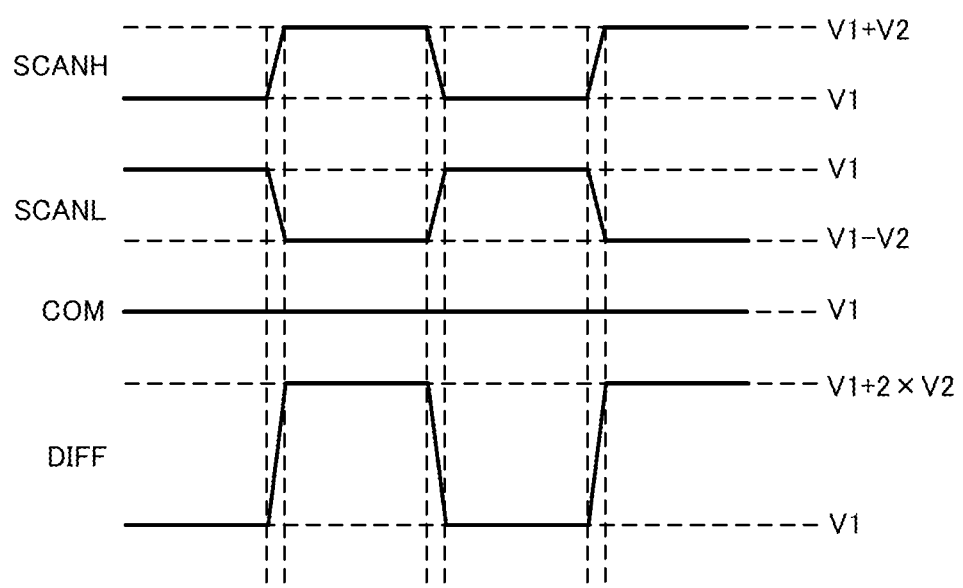
FIG. 5 is a time chart showing a differential signal.

The above-described first signal SCANH is a binary signal that assumes V1 or (V1+V2) as shown in FIG. 5, and the above-described second signal SCANL is a binary signal that assumes V1 or (V1−V2) as shown in FIG. 5. The differential signal (CAN signal) constituted of the first signal SCANH and the second signal SCANL can be decomposed into a common mode component COM representing an average of the first signal SCANH and the second signal SCANL and a differential mode component DIFF representing a difference between the first signal SCANH and the second signal SCANL.

When a time difference (skew) is caused between the first signal SCANH and the second signal SCANL, noise might occur in the common mode component COM. Such common mode noise that might occur due to skew, however, can be suppressed by adjusting each of the first signal SCANH and the second signal SCANL to have a waveform with a small high-frequency component.

To this end, in the transceiver circuit 4 of the configuration example shown in FIG. 4, a resistance value of the first variable resistor portion VR1 is gradually decreased in a first transition period in which a voltage value of the first signal SCANH makes a transition from V1 to (V1+V2) and a second transition period in which a voltage value of the second signal SCANL makes a transition from V1 to (V1−V2), and the resistance value of the first variable resistor portion VR1 is gradually increased in a third transition period in which the voltage value of the first signal SCANH makes a transition from (V1+V2) to V1 and a fourth transition period in which the voltage value of the second signal SCANL makes a transition from (V1−V2) to V1, so that each of the first signal SCANH and the second signal SCANL is adjusted to have a waveform with a small high-frequency component. In any other period than the above-described transition periods, the control portion CNT1 sets the resistance value of the first variable resistor portion VR1 to a maximum value.

Similarly, in the transceiver circuit 4 of the configuration example shown in FIG. 4, a resistance value of the second variable resistor portion VR2 is gradually decreased in the first transition period in which the voltage value of the first signal SCANH makes a transition from V1 to (V1+V2) and the second transition period in which the voltage value of the second signal SCANL makes a transition from V1 to (V1−V2), and the resistance value of the second variable resistor portion VR2 is gradually increased in the third transition period in which the voltage value of the first signal SCANH makes a transition from (V1+V2) to V1 and the fourth transition period in which the voltage value of the second signal SCANL makes a transition from (V1−V2) to V1, so that each of the first signal SCANH and the second signal SCANL is adjusted to have a waveform with a small high-frequency component. In any other period than the above-described transition periods, the control portion CNT1 sets the resistance value of the second variable resistor portion VR2 to a maximum value.

Figure 6:
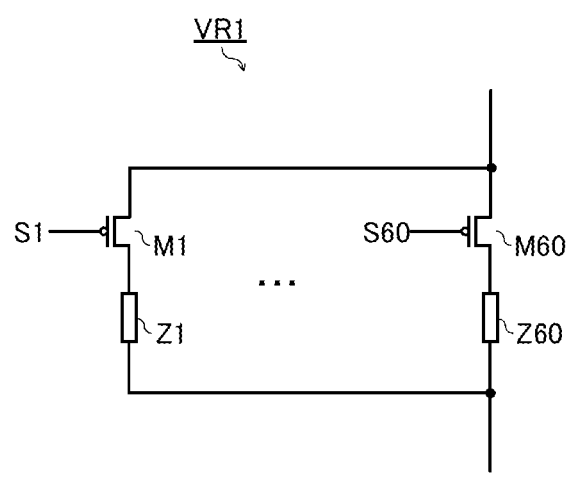
FIG. 6 is a view showing a configuration example of a first variable resistor portion.
Figure 7:
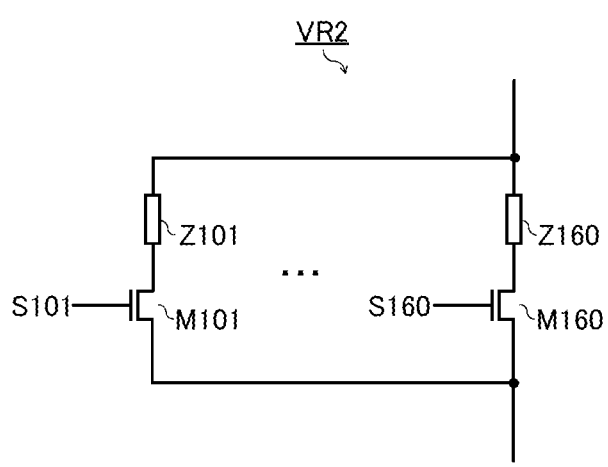
FIG. 7 is a view showing a configuration example of a second variable resistor portion.

FIG. 6 is a view showing a configuration example of the first variable resistor portion VR1, and FIG. 7 is a view showing a configuration example of the second variable resistor portion VR2.

The first variable resistor portion VR1 of the configuration example shown in FIG. 6 includes PMOS transistors M1 to M60 serving as switches and resistors Z1 to Z60 and thus is a circuit in which 60 series circuits each composed of a resistor and a switch are connected in parallel. Each of the PMOS transistors M1 to M60 is controlled to be turned on/off in accordance with a corresponding one of control signals S1 to S60 outputted from the control portion CNT1. The number of the above-described series circuits may be a plural number other than 60. In the configuration example shown in FIG. 6, a resistance value of the first variable resistor portion VR1 depends on a combined resistance of the resistors Z1 to Z60 and thus can be controlled with high accuracy.

The second variable resistor portion VR2 of the configuration example shown in FIG. 7 includes NMOS transistors M101 to M160 serving as switches and resistors Z101 to Z160 and thus is a circuit in which 60 series circuits each composed of a resistor and a switch are connected in parallel. Each of the NMOS transistors M101 to M160 is controlled to be turned on/off in accordance with a corresponding one of control signals S101 to S160 outputted from the control portion CNT1. The number of the above-described series circuits may be a plural number other than 60. In the configuration example shown in FIG. 7, a resistance value of the second variable resistor portion VR2 depends on a combined resistance of the resistors Z101 to Z160 and thus can be controlled with high accuracy.

NOTES

Besides the foregoing embodiment, the configuration of the present invention may be variously modified without departing from the gist of the invention. The foregoing embodiment is to be construed in all respects as illustrative and not limiting. The technical scope of the present invention is indicated by the appended claims rather than by the description of the foregoing embodiment, and it is to be understood that all changes that come within the meaning and range of equivalency of the claims are intended to be embraced therein.

For example, while the foregoing embodiment employs CAN communication as communication performed by the transceiver circuit, any other type of communication than the CAM communication may be employed as the communication performed by the transceiver circuit.

Furthermore, for example, a configuration may be employed in which the first variable resistor portion VR1 and the second variable resistor portion VR2 are each formed of a transistor, and an on-resistance of the transistor is adjusted in accordance with a control signal supplied to a control terminal of the transistor.

Furthermore, for example, as the first current restriction portion, a resistor may be used instead of the constant current source. Preferably, a resistance value of the resistor used as the first current restriction portion is smaller than a minimum resistance value of the first variable resistor portion VR1. This can suppress an influence on respective waveforms of the first signal SCANH and the second signal SCANL exerted by the resistor used as the first current restriction portion. Similarly, as the second current restriction portion, a resistor may be used instead of the constant current source. Preferably, a resistance value of the resistor used as the second current restriction portion is smaller than a minimum resistance value of the second variable resistor portion VR2. This can suppress an influence on the respective waveforms of the first signal SCANH and the second signal SCANL exerted by the resistor used as the second current restriction portion.

The transmission circuit (4) described above has a configuration (first configuration) including a first terminal (VCC) configured so that a first voltage is applied thereto, a second terminal (CANH), a third terminal (CANL), a fourth terminal (GND) configured so that a second voltage lower than the first voltage is applied thereto, a first variable resistor portion (VR1) provided between the first terminal and the second terminal and configured to vary in resistance value, a first current restriction portion (Q1) provided between the first terminal and the second terminal and configured to restrict a current flowing from the first terminal to the second terminal, a second variable resistor portion (VR2) provided between the third terminal and the fourth terminal and configured to vary in resistance value, a second current restriction portion (Q7) provided between the third terminal and the fourth terminal and configured to restrict a current flowing from the third terminal to the fourth terminal, and a control portion (CNT1) configured to control, based on transmission data, the respective resistance values of the first variable resistor portion and the second variable resistor portion.

In the transmission circuit of the above-described first configuration, an overcurrent flowing from the first terminal to the second terminal can be suppressed by the first current restriction portion. Furthermore, in the transmission circuit of the above-described first configuration, an overcurrent flowing from the third terminal to the fourth terminal can be suppressed by the second current restriction portion. Moreover, in the transmission circuit of the above-described first configuration, common mode noise that might occur due to skew can be suppressed through control of the respective resistance values of the first variable resistor portion and the second variable resistor portion performed by the control portion.

The transmission circuit of the above-described first configuration may have a configuration (second configuration) in which, in a case where a resistance value between the second terminal and the third terminal is smaller than usual, the first current restriction portion restricts the current flowing from the first terminal to the second terminal, while the second current restriction portion restricts the current flowing from the third terminal to the fourth terminal, in a case where a voltage between the first terminal and the second terminal is larger than usual, the first current restriction portion restricts the current flowing from the first terminal to the second terminal, and in a case where a voltage between the third terminal and the fourth terminal is larger than usual, the second current restriction portion restricts the current flowing from the third terminal to the fourth terminal.

In the transmission circuit of the above-described second configuration, an overcurrent can be suppressed properly by the first current restriction portion and the second current restriction portion.

The transmission circuit of the above-described second configuration may have a configuration (third configuration) in which, in a case where the second terminal and the third terminal are short-circuited, the first current restriction portion restricts the current flowing from the first terminal to the second terminal, while the second current restriction portion restricts the current flowing from the third terminal to the fourth terminal, in a case where the second terminal and the fourth terminal are short-circuited, the first current restriction portion restricts the current flowing from the first terminal to the second terminal, and in a case where the first terminal and the third terminal are short-circuited, the second current restriction portion restricts the current flowing from third terminal to the fourth terminal.

In the transmission circuit of the above-described third configuration, a more severe overcurrent can be suppressed properly by the first current restriction portion and the second current restriction portion.

The transmission circuit of any of the above-described first to third configurations may have a configuration (fourth configuration) in which the first variable resistor portion and the second variable resistor portion are each a circuit in which a plurality of series circuits each composed of a resistor and a switch is connected in parallel.

In the transmission circuit of the above-described fourth configuration, the respective resistance values of the first variable resistor portion and the second variable resistor portion can be controlled with high accuracy.

The transmission circuit of any of the above-described first to fourth configurations may have a configuration (fifth configuration) in which the first current restriction portion and the second current restriction portion each serve as a constant current source.

In the transmission circuit of the above-described fifth configuration, it is possible to suppress an influence on respective waveforms of signals outputted from the second terminal and the third terminal exerted by the first current restriction portion and the second current restriction portion.

The transmission circuit of the above-described fifth configuration may have a configuration (sixth configuration) in which the first current restriction portion is provided between the first terminal and the first variable resistor portion and is a p-channel type MOS transistor having a gate to which a first constant voltage is applied, and the second current restriction portion is provided between the second variable resistor portion and the fourth terminal and is an n-channel type MOS transistor having a gate to which a second constant voltage lower than the first constant voltage is applied.

In the transmission circuit of the above-described sixth configuration, the first current restriction portion and the second current restriction portion each have a simple configuration, and thus size and cost reductions can be achieved.

The transmission circuit of any of the above-described first to sixth configurations may have a configuration (seventh configuration) further including a pull-up resistor and a pull-down resistor, in which one end of the pull-up resistor is connected to the first terminal, the other end of the pull-up resistor is connected to one of both ends of the first variable resistor portion near the second terminal, one end of the pull-down resistor is connected to one of both ends of the second variable resistor portion near the third terminal, and the other end of the pull-down resistor is connected to the fourth terminal.

In the transmission circuit of the above-described seventh configuration, when the first variable resistor portion is brought to a high impedance state, a potential at the end of the first variable resistor portion near the second terminal can be stabilized by the pull-up resistor. Furthermore, in the transmission circuit of the above-described seventh configuration, when the second variable resistor portion is brought to a high impedance state, a potential at the end of the second variable resistor portion near the third terminal can be stabilized by the pull-down resistor.

The electronic control unit (1) described above has a configuration (eighth configuration) including the transmission circuit of any of the above-described first to seventh configurations and a computer (3) that transmits the transmission data to the transmission circuit.

The electronic control unit of the above-described eighth configuration is capable of suppressing common mode noise and an overcurrent in the transmission circuit.

The vehicle (X) described above has a configuration (ninth configuration) including a communication bus (BL1, BL2) and a plurality of electronic control units each being identical to the electronic control unit of the above-described eighth configuration and connected to the communication bus.

The vehicle of the above-described ninth configuration is capable of suppressing common mode noise and an overcurrent in the transmission circuit.

What is claimed is:
1. A transmission circuit, comprising:
 a first terminal configured so that a first voltage is applied thereto;
 a second terminal;
 a third terminal;
 a fourth terminal configured so that a second voltage lower than the first voltage is applied thereto;
 a first variable resistor portion provided between the first terminal and the second terminal and configured to vary in resistance value;

a first current restriction portion provided between the first terminal and the second terminal and configured to restrict a current flowing from the first terminal to the second terminal;

a second variable resistor portion provided between the third terminal and the fourth terminal and configured to vary in resistance value;

a second current restriction portion provided between the third terminal and the fourth terminal and configured to restrict a current flowing from the third terminal to the fourth terminal; and a control portion configured to control, based on transmission data, the respective resistance values of the first variable resistor portion and the second variable resistor portion, wherein the first current restriction portion and the second current restriction portion each serve as a constant current source.

2. The transmission circuit according to claim 1, wherein the first variable resistor portion and the second variable resistor portion are each a circuit in which a plurality of series circuits, each composed of a resistor and a switch, are connected in parallel.

3. The transmission circuit according to claim 1, wherein the first current restriction portion is provided between the first terminal and the first variable resistor portion and is a p-channel type MOS transistor having a gate to which a first constant voltage is applied, and the second current restriction portion is provided between the second variable resistor portion and the fourth terminal and is an n-channel type MOS transistor having a gate to which a second constant voltage lower than the first constant voltage is applied.

4. An electronic control unit, comprising:

the transmission circuit according to claim 1; and a computer that transmits the transmission data to the transmission circuit.

5. A vehicle, comprising:

a communication bus; and a plurality of electronic control units, each being identical to the electronic control unit according to claim 4 and connected to the communication bus.

* * * * *